(12) United States Patent
Yan et al.

(10) Patent No.: US 6,447,322 B1
(45) Date of Patent: Sep. 10, 2002

(54) TEST SOCKET FOR AN ELECTRONIC ASSEMBLY WHICH REDUCES DAMAGE TO THE ELECTRONIC ASSEMBLY

(75) Inventors: Hongfei Yan, Chandler; Michael S. Carrol, Phoenix, both of AZ (US)

(73) Assignee: Intle Corporation, Santa Clara, CA (US)

( * ) Notice: Subject to any disclaimer, the term of this patent is extended or adjusted under 35 U.S.C. 154(b) by 42 days.

(21) Appl. No.: 09/643,577

(22) Filed: Aug. 22, 2000

(51) Int. Cl.[7] ............................................. H01R 13/62
(52) U.S. Cl. ...................... 439/331; 361/709; 361/718
(58) Field of Search ................................ 361/709, 717, 361/718, 719; 439/73, 330, 331, 487

(56) References Cited

U.S. PATENT DOCUMENTS

| | | | | |
|---|---|---|---|---|
| 5,493,237 A | * | 2/1996 | Volz et al. | 324/754 |
| 5,621,615 A | * | 4/1997 | Dawson et al. | 361/704 |
| 5,953,212 A | * | 9/1999 | Lee | 361/709 |
| 5,989,039 A | * | 11/1999 | Sik | 439/73 |
| 6,000,125 A | * | 12/1999 | Kang | 29/832 |
| 6,152,744 A | * | 11/2000 | Maeda | 439/71 |
| 6,219,243 B1 | * | 4/2001 | Ma et al. | 361/704 |
| 6,226,185 B1 | * | 5/2001 | Lin | 361/704 |
| 6,292,369 B1 | * | 9/2001 | Daves et al. | 361/719 |

* cited by examiner

Primary Examiner—Tulsidas Patel
Assistant Examiner—Thanh-Tam Le
(74) Attorney, Agent, or Firm—Blakely, Sokoloff, Taylor & Zafman LLP

(57) ABSTRACT

A test socket for an electronic assembly comprising a holder, a plurality of electric terminals, a heat sink, a compliant and thermally conductive thermal interface component, and a heat sink biasing device is provided. The holder has a formation to receive the electronic assembly. The electric terminals are located on the holder, each for making contact with a respective electric contact and the electronic assembly to test an integrated circuit of the electronic assembly. The heat sink is secured to the holder. The thermal interface component is attached to a surface of the heat sink. The heat sink biasing device has a first portion connected to the holder and a second portion connected to the heat sink, the second portion being biased relative to the first portion to move the heat sink from a loading position wherein the electronic assembly is insertable into the holder, to a testing position wherein the heat sink is located next to the electronic assembly with the thermal interface component between the surface of the heat sink and the electronic assembly and contacting the electronic assembly.

21 Claims, 2 Drawing Sheets

TEST SOCKET FOR AN ELECTRONIC ASSEMBLY WHICH REDUCES DAMAGE TO THE ELECTRONIC ASSEMBLY

BACKGROUND OF THE INVENTION

1). Field of the Invention

This invention relates to a test socket for an electronic assembly.

2). Discussion of Related Art

U.S. Pat. No. 5,865,639 describes a test socket that can be used for testing an electronic assembly. The test socket has a holder having a recess for receiving the electronic assembly. Heat sinks are pivotally secured to the holder and are biased from a loading position, wherein the electronic assembly can be located in the holder, to a testing position wherein the heat sinks contact a surface of an integrated circuit of the electronic assembly. The heat sinks have large mass and velocity, and therefore kinetic energy when they strike the integrated circuit. Impact forces created by the heat sinks on the integrated circuit often result in damage to the integrated circuit.

BRIEF DESCRIPTION OF THE DRAWINGS

This invention is described by way of example with reference to the accompanying drawings wherein.

DETAILED DESCRIPTION OF THE INVENTION

Figure 1:
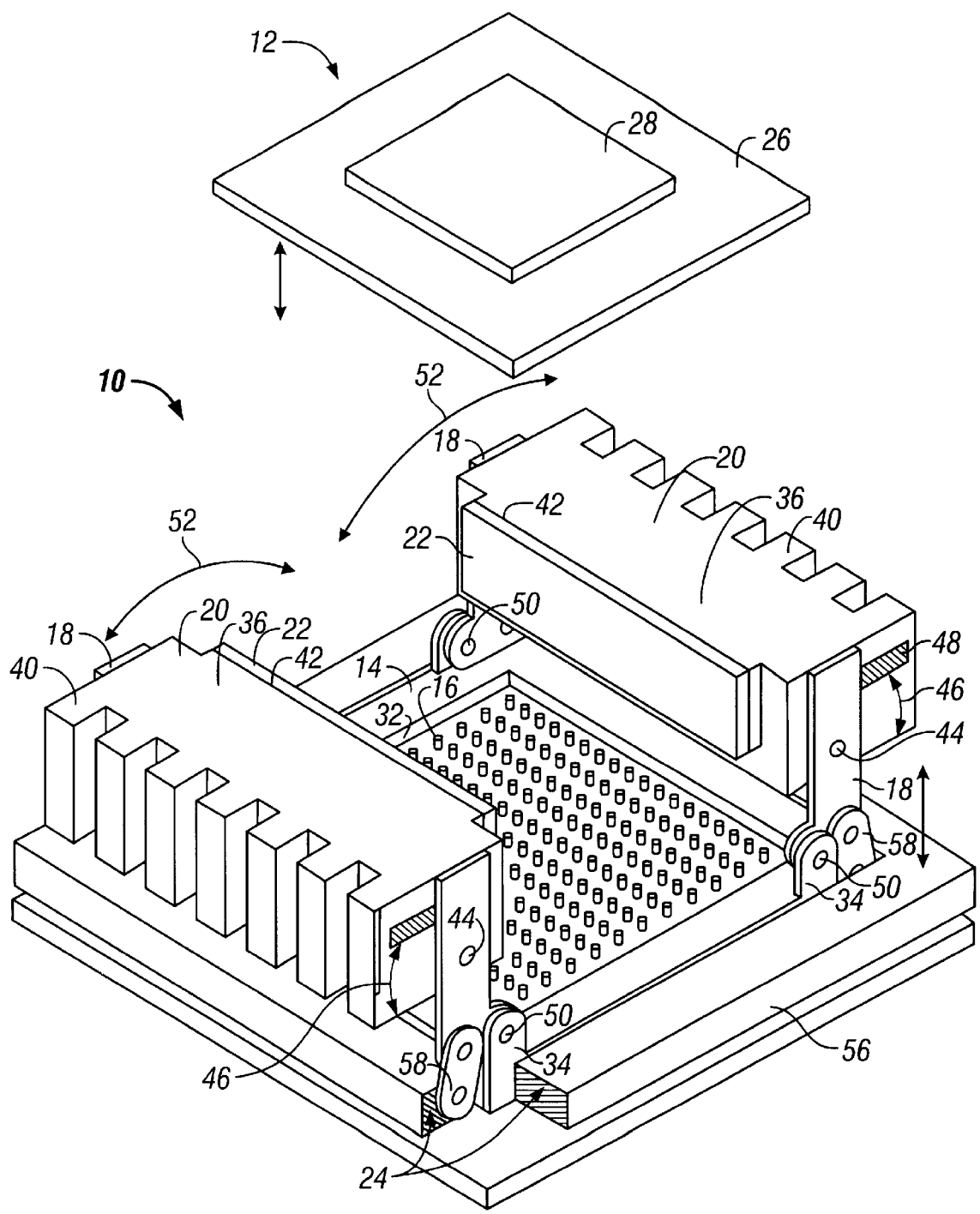
FIG. 1 is a perspective view of a test socket according to an embodiment of the invention, used for testing an electronic assembly.

FIG. 1 of the accompanying drawings illustrates a test socket 10, according to an embodiment of the invention, which is used for testing an electronic assembly 12. The test socket 10 includes a holder 14, terminals 16, four lever arms 18, two heat sinks 20, two thermal interface components 22, and an actuation mechanism 24.

The electronic assembly includes a substrate 26 and an integrated circuit 28. The substrate 26 has a substantially rectangular shape and the integrated circuit 28 also has a substantially rectangular shape and is mounted to a central area of the substrate 26.

The holder 14 defines a substantially rectangular recess 32. The recess 32 substantially conforms with the substantially rectangular shape of the substrate 26. The terminals 26 are located in an array in a base of the recess 32. Pivot structures 34 are formed near corners on the holder 14.

Each heat sink 20 has a thermal spreader component 36 and a plurality of fins 40. The thermal spreader component 36 has a surface 44 on one side thereof and the fins 40 extend from an opposing side thereof. Pivot pins 44 secure each respective heat sink 20 to and between two of the lever arms 18. Each respective heat sink 20 can thereby pivot in directions 46 relative to the lever arms 18. A respective spring 48 biases a respective heat sink 20 for movement in one direction about the pivot pins 44.

Each lever arm 18 is secured to a respective pivot structure 34 by a respective pivot pin 50. The lever arms 18 and the heat sinks 20 are thereby pivotally secured to the holder 14. Each heat sink 20 can pivot in directions 52 towards or away from the terminals 16 in the recess 32.

A respective one of the thermal interface components 22 is attached to a respective one of the surfaces 42. Each one of the thermal interface components 22 is made of a material that is compliant so that it can be depressed so as to absorb shock, resilient so as to substantially return to its original shape, and thermally conductive.

Figure 2:
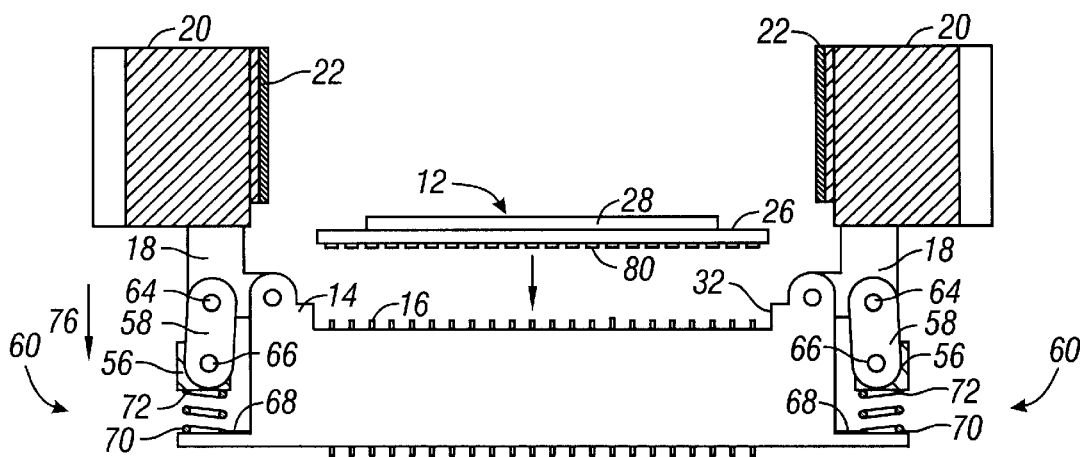
FIG. 2 is a cross-sectional side view of the test socket shown in FIG. 1.

The actuation mechanism 24 includes a rectangular return ring 56, four links 58 and, as shown in FIG. 2, four biasing springs 60 (two of which are shown). Each link 58 has one end that is pivotally secured to a respective one of the lever arms 18 by a respective pivot pin 64, and an opposing end that is pivotally secured to the return ring 56 by another pivot pin 66. The biasing springs 60 are located between the return ring 56 and a surface 68 of the holder 14 so that each spring has a lower portion 70 resting on the surface 68 and an upper portion 72 contacting a lower surface of the return ring 56.

In use, the return ring 56 is moved in a downward direction 76, thereby compressing the springs 60 so that the upper portions 72 of the springs move closer to the lower portion 70. Each spring 60 is compressed against a spring force thereof. Movement of the return ring 56 in the downward direction 76 causes movement of the heat sinks 20 into loading positions wherein the heat sinks 20 are positioned as shown in FIG. 1 and FIG. 2. The heat sinks 20 are located distant from the terminals 16 in the recess 32. The electronic assembly 12 can thereby be inserted into the holder 14. The rectangular shape of the substrate 26 fits complementarily within the shape of the recess 32. A plurality of electric contacts 80 are formed on a lower surface of the substrate 26. Each terminal 16 contacts a respective one of the contacts 80.

Figure 3:
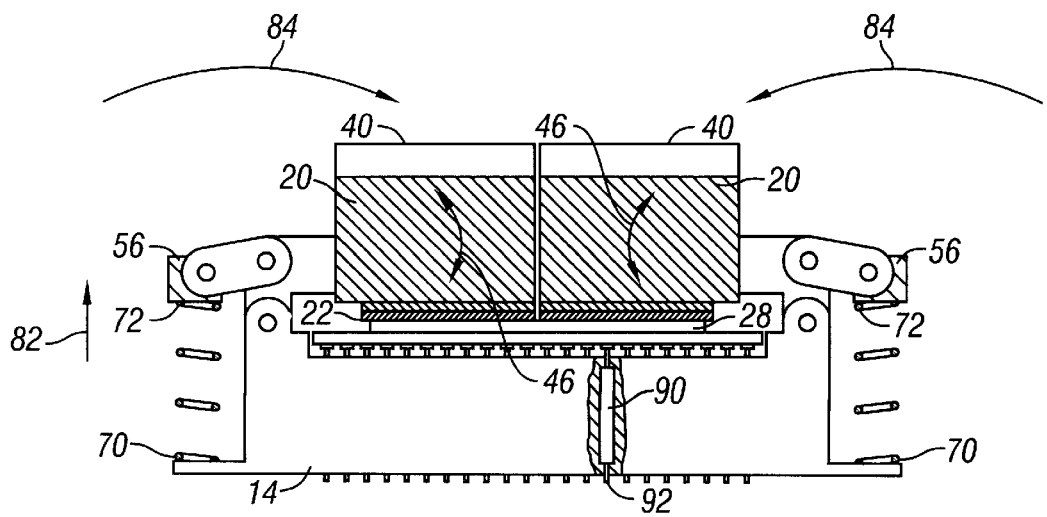
FIG. 3 is a view similar to FIG. 2 after heat sinks of the test sockets are moved from a loading position into a testing position.

A force acting on the return ring 56 which compresses the springs 60 is then released. The springs relax and extend, as shown in FIG. 3, so that the upper portions 72 of the springs move away from the lower portions 70 thereof. The return ring 56 moves together with the upper portions 72 in an upward direction 82. Movement of the return ring 56 in the upward direction 82 results in pivoting of each heat sink 20 into a testing position in directions 84 towards the integrated circuit 28. The heat sinks 20 have large mass and velocity, and therefore a large amount of kinetic energy as they approach the integrated circuit 28. Large impact forces are created on the integrated circuit once the thermal interface components 22 strike the integrated circuit 28. However, the thermal interface components 22 are sufficiently thick and compliant to absorb shock created by impact between the thermal interface components 22 and the integrated circuit 28.

The thermal interface components 22 combined are wider than an upper surface of the integrated circuit 28 so that each thermal interface component 22 is located partially on and partially off the integrated circuit 28, or over an edge of the integrated circuit 28. Because the thermal interface components 22 are compliant, they do not damage edges of the upper surface of the integrated circuit 28, as may be the case without the thermal interface components. Moreover, integrated circuits having different size upper surfaces can be tested without damage to edges thereof by the surfaces 42.

The heat sinks 20 can pivot in the directions 46, thereby ensuring proper seating of the thermal interface components 22 on the integrated circuit 28. Pivoting of the heat sinks 20 in the directions 46 does not reduce damage that may occur on edges of the integrated circuit 28 without the thermal interface components 22. It is believed that pivoting in the directions 46 may even add to the dynamics of the movement of the heat sinks 20 and further damage the integrated circuit 28 in the absence of the thermal interface components 22, in particular at edges of the integrated circuit 28. It is believed that the thermal interface components 28 need to be at least twenty, preferably at least fifty times as compliant as the surface 42, and need to be at least four mil thick in order to sufficiently absorb shock.

The terminals 16 are in fact tips of spring pins 90 that are located within the holder 14. Opposing tips 92 of the spring pins 90 extend from an opposing side of the holder 14. Electronic signals can be transmitted from the tips 92 to the terminals 16, and from the terminals 16 through a respective contact 80, and through vias in the substrate 26 to the integrated circuit 28. By selectively transmitting signals to and from the integrated circuit 28, the integrated circuit can be tested. Testing of the integrated circuit 28 results in heating thereof. In order to maintain the temperature of the integrated circuit at a required level, the heat is transferred from the integrated circuit 28 through the thermal interface component 22 to the heat sinks 20, from where the heat is convected from the fins 40.

The thermal interface components 22 therefore have to be made of material which is sufficiently thermally conductive. Ideally, the same amount or substantially the same amount of heat should be transferred when the thermal interface components 22 are in place than without the use of the thermal interface components 22 and with the heat sinks 20 making direct contact onto the integrated circuit 28, all other conditions being the same. As such, the thermal interface components 22 should have a thermal conductivity, in the direction from the integrated circuit 26 to the heat sinks 20, of at least three, preferably at least four watt per meter Kelvin (W/mK).

Testing of the integrated circuit 28 is then terminated, whereafter the return ring 56 is again moved from the positions shown in FIG. 3 to the positions shown in FIG. 2. The heat sinks 20 thereby pivot from the testing position shown in FIG. 3 to the loading position shown in FIG. 2. The electronic assembly 12 can then again be removed from the holder 14. Another electronic assembly 12 may then be inserted into the holder 14 in a manner as described in FIG. 2, the heat sinks 20 be pivoted towards the electronic assembly 12, the electronic assembly 12 tested, whereafter the electronic assembly 12 can again be removed. This procedure is repeated a third and subsequent times. In order for the thermal interface components 22 to maintain their compliancy, it is required that they be sufficiently resilient to at least partially return to their original shape after each cycle. As such, the thermal interface component 22 should be made of a material which is sufficiently resilient to maintain at least fifty percent of its compliancy after one thousand cycles and at least twenty percent of its compliancy after ten thousand cycles.

It can thus be seen that the thermal interface component 22 should be made of a material of sufficient thickness and compliancy to absorb shock. The material should have an optimal thermal conductivity and not be so thick as to reduce heat transferred to an unacceptable extent. The material should also be sufficiently resilient to maintain its compliancy after repeated cycles. One such material is GRAFOIL® 705A sold by UCAR Carbon Company, Inc. of Tennessee, having a thickness of five mil. This material has a thermal conductivity of seven W/mK in a direction of its thickness. Another material that may be used is T-gon 805 sold by Thermagon, Inc. of Ohio, having a thickness of five mil. This material has a thermal conductivity of about five W/mK in a direction of its thickness. Another material that may be used is PGS Graphite sheets sold by Matsushita Electric Industrial Co., Ltd., of Osaka, Japan, having a thickness of four mil. This material has a thermal conductivity of about five W/mK in a direction of its thickness. Another material that may be used is GRAFOIL® 710A sold by UCAR Carbon Company, Inc., having a thickness of ten mil. This material has a thermal conductivity of about seven W/mK in its thickness direction. Another material that may be used in GRAFOIL® 1210A sold by UCAR Carbon Company, Inc., having a thickness of about ten mil. This material has a thermal conductivity of about twelve W/mK in its direction of thickness.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed is:

1. A test socket for an electronic assembly, comprising:
   a holder having a formation to receive the electronic assembly;
   a plurality of electric terminals on the holder, each to make contact with a respective electric contact on the electronic assembly to test an integrated circuit of the electronic assembly;
   a heat sink secured to the holder;
   a compliant and thermally conductive thermal interface component attached to a surface of the heat sink; and
   a heat sink biasing device having a first portion connected to the holder and a second portion connected to the heat sink, the second portion being biased relative to the first portion to move the heat sink from a loading position wherein the electronic assembly is insertable into the holder, to a testing position wherein the heat sink is located next to the electronic assembly with the thermal interface component between the surface of the heat sink and the electronic assembly and contacting the electronic assembly.

2. The test socket of claim 1 wherein the formation is a recess into which a substrate of the electronic assembly is insertable with the integrated circuit mounted to the substrate.

3. The test socket of claim 1 wherein the heat sink is secured to the holder for pivotal movement between the loading position and the testing position.

4. The test socket of claim 3 further comprising:
   a lever arm pivotally secured to the holder, the heat sink being secured to the lever arm so as to move between the loading position and the testing position upon pivoting of the lever arm.

5. The test socket of claim 4 wherein the heat sink is pivotally secured to the lever arm to allow for seating of the thermal interface component on the electronic assembly.

6. The test socket of claim 1 comprising two heat sinks, each being movably secured to the housing, and two thermal interface components, each being attached to a surface of a respective heat sink.

7. The test socket of claim 6 wherein the same heat sink biasing device biases both heat sinks between respective loading and testing positions.

8. The test socket of claim 1 wherein the thermal interface component has a thermal conductivity of at least four W/mK in a direction from the electronic assembly to the surface.

9. The test socket of claim 1 wherein the thermal interface component has a thickness of at least four mil.

10. The test socket of claim 1 wherein the thermal interface component is selected from the group consisting of GRAFOIL® 705A, T-gon 805, PGS Graphite sheet, GRAFOIL® 701A, and GRAFOIL® 1210A.

11. The test socket of claim 1 further comprising a heat sink returning structure connected to the heat sink, being actuable to move the heat sink from the testing position to the loading position against a force of the heat sink biasing device to allow for removal of the electronic assembly from the holder, the thermal interface component being sufficiently resilient to repeatedly be compressed between subsequent electronic assemblies that are inserted in the holder and the surface of the heat sink.

12. A test socket for an electronic assembly, comprising:
- a holder having a formation to releasably receive the electronic assembly;
- a plurality of electric terminals on the holder, each to make contact with a respective electric contact on the electronic assembly so that signals can be sent from the electric terminal through the electric contacts to an integrated circuit of the electronic assembly so as to test the integrated circuit, testing of the integrated circuit resulting in heat being generated by the electronic assembly;
- a heat sink movably secured to the housing;
- a compliant, thermally conductive and resilient thermal interface component attached to a surface of the heat sink;
- a heat sink biasing device having a first portion connected to the holder and a second portion connected to the heat sink, the second portion being biased relative to the first portion by a force that moves the heat sink relative to the housing from a loading position wherein the thermal interface component is distant from the electronic assembly and the electronic assembly is insertable into the holder, to a testing position wherein the heat sink is located next to the electronic assembly with the thermal interface component between the surface of the heat sink and the electronic assembly and contacting the electronic assembly, the thermal interface component being sufficiently compliant to reduce shock on the electronic assembly when the heat sink is moved into the testing position, and sufficiently thermally conductive to conduct heat from the electronic assembly to the heat sink when the integrated circuit is tested; and
- a heat sink returning structure connected to the heat sink, being actuable to move the heat sink from the testing position to the loading position against the force of the heat sink biasing device to allow for removal of the electronic assembly from the holder, the thermal interface component being sufficiently resilient to repeatedly be compressed between subsequent electronic assemblies that are inserted in the holder and the surface of the heat sink.

13. The test socket of claim 12 wherein the thermal interface component has a thermal conductivity of at least four W/mK in a direction from the electronic assembly to the surface.

14. The test socket of claim 12 wherein the thermal interface component has a thickness of at least four mil.

15. The test socket of claim 12 wherein the thermal interface component is selected from the group consisting of GRAFOIL® 705A, T-gon 805, PGS Graphite sheet, GRAFOIL® 701A, and GRAFOIL® 1210A.

16. The test socket of claim 12 further comprising a heat sink returning structure connected to the heat sink, being actuable to move the heat sink from the testing position to the loading position against a force of the heat sink biasing device to allow for removal of the electronic assembly from the holder, the thermal interface component being sufficiently resilient to repeatedly be compressed between subsequent electronic assemblies that are inserted in the holder and the surface of the heat sink.

17. A method of testing an electronic assembly, comprising:
(i) moving a heat sink secured to a housing from a testing position to a loading position to allow for an electronic assembly to be received by the holder;
(ii) receiving and holding a substrate of the electronic assembly in the holder while the heat sink is in the loading position;
(iii) contacting a respective electric contact on the substrate with a respective electric terminal on the holder;
(iv) biasing the heat sink from the loading position into the testing position thereby compressing a compliant, thermally conductive and resilient thermal interface component between a surface of the heat sink and a surface over an integrated circuit mounted to the substrate;
(v) transmitting electric signals though the electric contacts and the electric contact to test the integrated circuit, testing of the integrated circuit causing generation of heat by the integrated circuit, the thermal interface material being sufficiently thermally conductive to transfer heat from the integrated circuit to the heat sink;
(vi) terminating testing of the integrated circuit;
(vii) moving the heat sink from the testing position into the loading position, the thermal interface component being sufficiently resilient to at least partially return to its original shape before being compressed; and
(viii) removing the electronic assembly from the holder while the heat sink is in the loading position.

18. The method of claim 17 wherein the thermal interface material is at least fifty times as compliant as the surface of the heat sink.

19. The method of claim 17 wherein substantially as much heat is transferred to the heat sink as an amount of heat transferred to the heat sink without the thermal interface component, all other conditions being the same.

20. The method of claim 17 comprising repeating (i) to (viii) at least one thousand times, the thermal interface component retaining at least fifty percent of its compliancy.

21. The method of claim 17 wherein the thermal interface component is located partially on and partially off the integrated circuit when the heat sink is in the testing position.

* * * * *